(12) United States Patent
Lu et al.

(10) Patent No.: US 8,993,409 B2
(45) Date of Patent: Mar. 31, 2015

(54) SEMICONDUCTOR OPTICAL DEVICE HAVING AN AIR MEDIA LAYER AND THE METHOD FOR FORMING THE AIR MEDIA LAYER THEREOF

(75) Inventors: Tien-Chang Lu, Hsinchu (TW);
Huei-Min Huang, Hsinchu (TW);
Hao-Chung Kuo, Hsinchu (TW);
Shing-Chung Wang, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 121 days.

(21) Appl. No.: 13/414,944

(22) Filed: Mar. 8, 2012

(65) Prior Publication Data

US 2013/0146896 A1  Jun. 13, 2013

(30) Foreign Application Priority Data

Dec. 9, 2011 (TW) .............................. 100145456 A (51) Int. Cl.
*H01L 33/00* (2010.01)
*H01L 33/20* (2010.01)

(52) U.S. Cl.
CPC ........... *H01L 33/0095* (2013.01); *H01L 33/007* (2013.01); *H01L 33/20* (2013.01); *H01L 2933/0083* (2013.01)
USPC ................................ 438/456; 257/76; 257/77

(58) Field of Classification Search
CPC ....................................................... H01L 21/20
USPC ........................ 257/77, 76, 615, 623; 438/456
See application file for complete search history.

(56) References Cited

U.S. PATENT DOCUMENTS

| 6,686,257 B1* | 2/2004 | Wu et al. ........................ 438/458 |
| 6,861,729 B2* | 3/2005 | Kozaki et al. ................. 257/623 |
| 6,989,312 B2* | 1/2006 | Song et al. .................... 438/390 |
| 7,084,044 B2* | 8/2006 | Lentz et al. ................... 438/412 |
| 7,577,175 B2* | 8/2009 | Lu et al. ..................... 372/45.01 |
| 7,588,955 B2* | 9/2009 | Huang et al. .................... 438/34 |
| 7,625,809 B2* | 12/2009 | Suzuki et al. ................. 438/456 |
| 7,888,270 B2* | 2/2011 | Lee et al. ...................... 438/745 |
| 7,989,244 B2* | 8/2011 | Kim et al. ....................... 438/46 |
| 8,859,399 B2* | 10/2014 | Zang et al. ..................... 438/478 |
| 2005/0186757 A1* | 8/2005 | Wu et al. ....................... 438/455 |
| 2007/0134901 A1* | 6/2007 | Chang et al. .................. 438/604 |
| 2009/0020772 A1* | 1/2009 | Chiu et al. ....................... 257/98 |
| 2009/0061636 A1* | 3/2009 | Lee et al. ...................... 438/703 |
| 2009/0098714 A1* | 4/2009 | Chang et al. .................. 438/478 |
| 2009/0124042 A1* | 5/2009 | Horio et al. ................... 438/104 |

(Continued)

OTHER PUBLICATIONS

Lin et al., "An AlN Sacrificial Buffer Layer Inserted into the GaN/Patterned Sapphire Substrate for a Chemical Lift-Off Process", Applied Physics Express 3 (2010) 031001.*

(Continued)

*Primary Examiner* — Jarrett Stark
*Assistant Examiner* — Charles N Ausar-El
(74) *Attorney, Agent, or Firm* — Bacon & Thomas, PLLC (57) ABSTRACT

A method for fabricating air media layer within the semiconductor optical device is provided. The step of method includes a substrate is provided, a GaN thin film is formed on the substrate, a sacrificial layer is formed on the GaN thin film, and a nitride-containing semiconductor layer is formed on the sacrificial layer. The semiconductor optical device is immersed with an acidic solution to remove the portion of sacrificial layer to form an air media layer around the residual sacrificial layer.

1 Claim, 6 Drawing Sheets

(56) References Cited

U.S. PATENT DOCUMENTS

| | | | |
|---|---|---|---|
| 2010/0323506 A1* | 12/2010 | Cheng et al. | 438/507 |
| 2012/0146190 A1* | 6/2012 | Liu et al. | 257/615 |
| 2012/0267638 A1* | 10/2012 | Lee et al. | 257/76 |
| 2014/0061664 A1* | 3/2014 | Joichi et al. | 257/76 |

OTHER PUBLICATIONS

Lipski et al., "Studies towards freestanding GaN in hydride vapor phase epitaxy by in-situ etching of a sacrificial ZnO buffer layer" Physica Status Solidi C 6, No. S2, S352-S355 (2009).*

Yablonovitch et al., "Extreme selectivity in the lift-off of epitaxial GaAs films", Applied Physics Letters 51 (26) Dec. 28, 1987 2222-2224.*

Wang et al., "Improvement of microstructural and optical properties of GaN layer on sapphire by nanoscale lateral epitaxial overgrowth" Applied Physics Letters 88, 211908 (2006).*

"Semiconductor Optical Device Having an Air Media Layer and the Method for Forming the Air Media Layer Thereof" in Patent Application Approval Process, HighBeam Research, Politics & Goverment Week, Jul. 4, 2013, pp. 1-5, www.highbeam.com.*

* cited by examiner

SEMICONDUCTOR OPTICAL DEVICE HAVING AN AIR MEDIA LAYER AND THE METHOD FOR FORMING THE AIR MEDIA LAYER THEREOF

BACKGROUND OF THE INVENTION

1. Field of the Invention

The invention relates to a method for fabricating a nitride semiconductor optical device, particularly the method for forming the air media layer within the nitride semiconductor optical device.

2. Description of the Prior Art

As for the structure of nitride semiconductor embedded with the air media layer, the light field can be confined in the nitride semiconductor material with high refractive index through the air media with low refractive index. Furthermore, the E-beam lithography is used to define the micro-structure on the nitride surface to form the micro resonance cavity in the nitride material. Its optical characteristics are studied through the different structural design of nitride. Due to the chemical property of nitride semiconductor is stable, it is difficult to remove the bottom semiconductor material to form nitride semiconductor thin film by the wet etching method. In the conventional art, different nitride material is used as the material of sacrificial layer. The optical chemical oxidization etching reaction is used to remove the nitride in the sacrificial layer. However, the etching rate and homogeneity of optical chemical oxidization etching reaction are not good, it is apt to cause uneven surface and even cause the structural defect or the drop of device characteristics.

Though the match between the nitride and the nitride semiconductor is well known, the lattice constant between them is very close, thus they are perfect match basically. However, it is still necessary to pay attention to the crystal quality of heterogeneous epitaxy. Therefore the invention discloses how to grow high-quality nitride and improve the heterogeneous structure of oxide.

SUMMARY OF THE INVENTION

According to the shortcoming of the prior art, the invention provides a method for fabricating air media layer within the semiconductor optical device.

The main purpose of invention is to raise the performance of semiconductor optical device through the sandwich structure formed by the air media layer and nitride layer.

Another purpose of the invention is to immerse the semiconductor optical device in an acidic solution to remove the portion of sacrificial layer to form an air media layer within the semiconductor optical device.

According to the above-mentioned purposes, the invention provides a method for fabricating the air media layer within the semiconductor optical device. The step of method includes: a substrate is provided, a GaN thin film is formed on the substrate, a sacrificial layer is formed on the GaN thin film, and a nitride-containing semiconductor layer is formed on the sacrificial layer. The semiconductor optical device is immersed with an acidic solution to remove the portion of sacrificial layer to form an air media layer around the residual sacrificial layer.

In an embodiment of the invention, the formation method of the above-mentioned GaN thin film is the Metal-Organic Chemical Vapor Deposition.

In an embodiment of the invention, the formation method of the above-mentioned sacrificial layer is the Molecular Beam Epitaxy.

In an embodiment of the invention, the temperature range for the formation of the above-mentioned sacrificial layer is 500° C. to 700° C.

In an embodiment of the invention, the above-mentioned acidic solution includes the nitric acid or nitromuriatic acid.

In an embodiment of the invention, the above-mentioned etching step includes a micro-structural pattern is defined on the nitride-containing semiconductor. The etching is used to remove a portion of nitride-containing semiconductor layer to form a plurality of micro-structures within the nitride-containing semiconductor. The wet etching is used to remove a portion of sacrificial layer to form an air media layer between the GaN thin film and the nitride-containing semiconductor layer.

In an embodiment of the invention, the definition method of the above-mentioned micro-structural pattern includes the E-beam lithography.

In an embodiment of the invention, the etching method of removing a portion of nitride-containing semiconductor layer includes the inductively coupled plasma reactive ion etching (ICP-RIE).

In an embodiment of the invention, the above-mentioned nitride-containing semiconductor layer further includes a metal bonding layer.

In an embodiment of the invention, another substrate is formed on the above-mentioned metal bonding layer.

In addition, according to the above-mentioned fabrication method, the invention even discloses a semiconductor optical device having air media layer, which includes: a first substrate, a GaN thin film is formed on the first substrate, an air media layer is formed on the GaN thin film, and a nitride-containing semiconductor layer is formed on the air media layer, wherein the air media layer includes a sacrificial layer.

In an embodiment of the invention, the material of the above-mentioned first substrate is the silicon carbide (SiC) or Sapphire.

In an embodiment of the invention, the structure of sacrificial layer within the above-mentioned air media layer is single cylindrical structure.

In an embodiment of the invention, there is a plurality of micro-structures within the above-mentioned nitride-containing semiconductor layer.

In an embodiment of the invention, the plurality of micro-structures within the above-mentioned nitride-containing semiconductor layer is irregularly arranged cylindrical structure.

In an embodiment of the invention, the plurality of micro-structures within the above-mentioned nitride-containing semiconductor layer is matrix arranged cylindrical structure.

In an embodiment of the invention, the above-mentioned nitride-containing semiconductor layer even includes the bonding metal layer and the second substrate.

In order to understand the above-mentioned purposes, characteristics and advantages of present invention more obviously, the detailed explanation is described as follows with preferred embodiments and figures.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some embodiments of the invention will be described in detail as follows. However, except the detailed description, the invention can be implemented in other embodiments widely. Besides, the scope of the invention is not limited.

Figure 1:
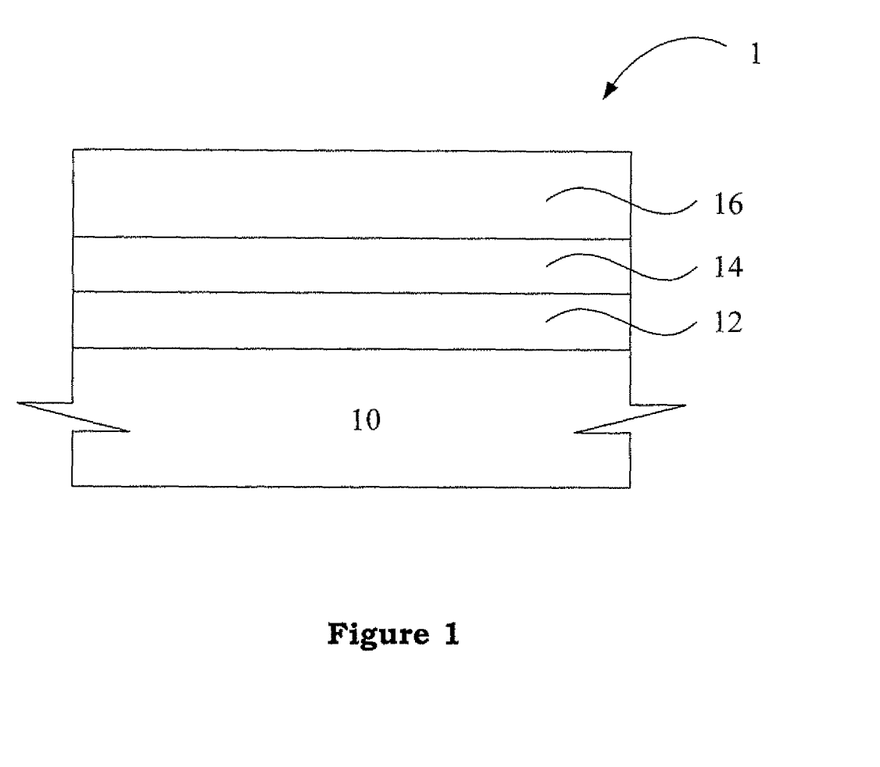
FIG. 1 illustrates the cross-section diagram for a semiconductor optical device in accordance with the technique disclosed in the invention.

Please referring to FIG. 1. FIG. 1 illustrates a cross-section diagram for a semiconductor optical device.

As shown in FIG. 1, its structure includes a substrate 10, a GaN thin film 12 is formed on the substrate 10, a sacrificial layer 14 is formed on the GaN thin film 12 and a nitride-containing semiconductor layer 16 is formed on the sacrificial layer 14. The material of substrate 10 may be the sapphire or silicon carbide (SiC). The GaN thin film 12 is formed on the substrate 10 by the Metal-Organic Chemical Vapor Deposition (MOCVD). The material of sacrificial layer 14 is the zinc oxide (ZnO), which is formed on the GaN thin film 12 by the Molecular Beam Epitaxy, and the temperature range is 500° C. to 700° C. The nitride-containing semiconductor layer 16 is formed on the sacrificial layer 14 by the Molecular Beam Epitaxy.

Figure 2:
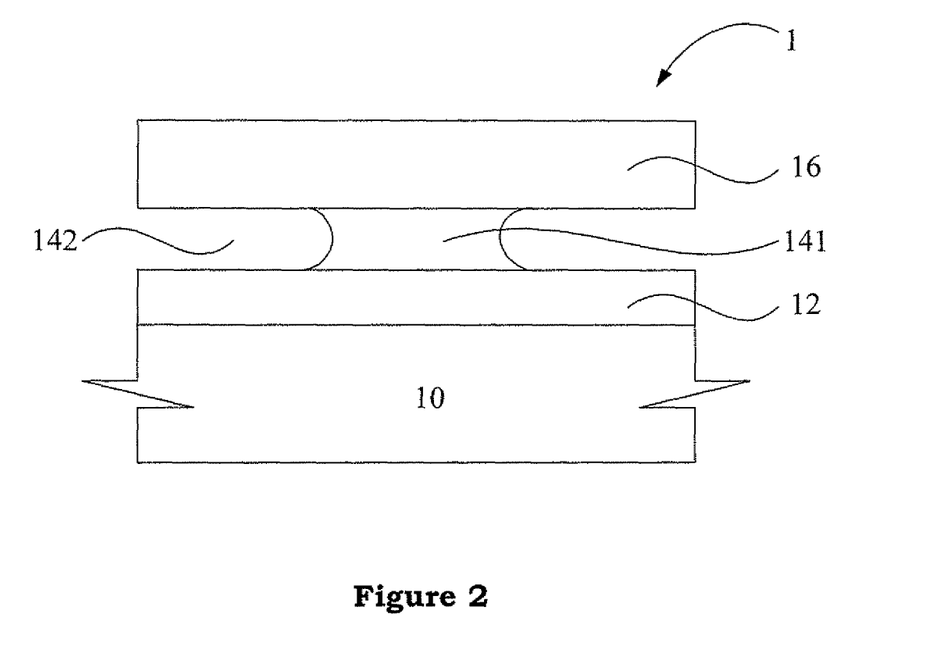
FIG. 2 illustrates the cross-section diagram for a semiconductor optical device having air media layer in accordance with the technique disclosed in the invention.

As shown in FIG. 1, due to the zinc oxide used for the sacrificial layer 14 is the precursor for fabricating the air media layer, and because the etching speed is quick for the oxide semiconductor material in the acidic solution with low pH, thus the wet etching is used. The above-mentioned semiconductor optical device is immersed in an acidic solution (not shown in figure) about pH 1 to remove a portion of sacrificial layer 14, so that the residual sacrificial layer 141 is formed between the GaN thin film 12 and the nitride-containing semiconductor layer 16. The removed portion of sacrificial layer 14 forms an air media layer 142 between the GaN thin film 12 and the nitride-containing semiconductor layer 16, as shown in FIG. 2. Due to low refractive index of air media, the light can be confined in nitride structure. The wet etching can improve the uneven surface of GaN thin film 14 caused by the conventional art, and increase the light emitting efficiency of semiconductor optical device. In an embodiment disclosed by the invention, the acidic solution includes the nitric acid or nitromuriatic acid.

Figure 3:
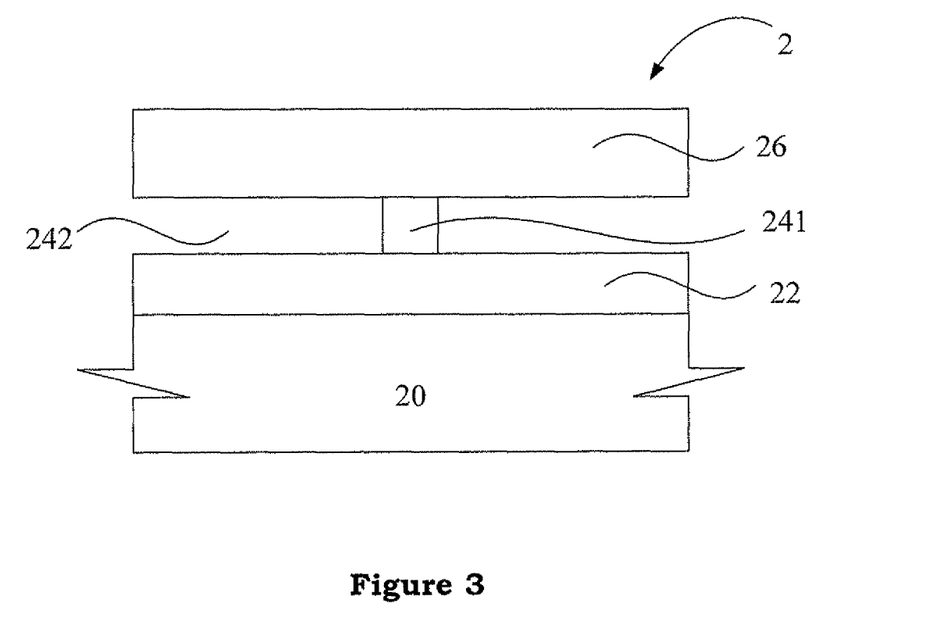
FIG. 3 illustrates the cross-section diagram for another embodiment of semiconductor optical device having air media layer in accordance with the technique disclosed in the invention.

In another embodiment of the invention shown in FIG. 3, the immersion time of the semiconductor optical device 2 in the acidic solution can be controlled to form the residual sacrificial layer 241 with cylindrical structure. The air media layer 242 is formed between the GaN thin film 22 and the nitride-containing semiconductor layer 26.

Figure 4:
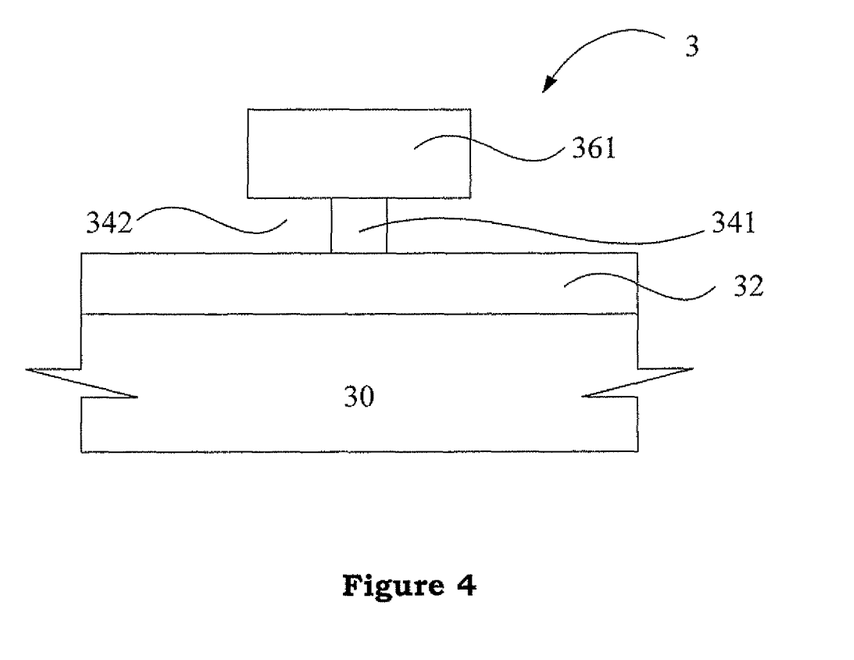
FIG. 4 illustrates the cross-section diagram for another embodiment of semiconductor optical device having air media layer in accordance with the technique disclosed in the invention.

As shown in FIG. 4, the invention further discloses a method for forming an air media layer within a semiconductor optical device 3. In FIG. 4, the structure of semiconductor optical device 3 is the same as that of FIG. 1, which will not be described here again. The step of forming the air media layer 342 between the GaN thin film 32 and the nitride-containing semiconductor layer 361 includes the micro-structural pattern is defined on the nitride-containing semiconductor layer 36 by E-beam lithography. The inductively coupled plasma reactive ion etching (ICP-RIE) is used to remove a portion of nitride-containing semiconductor layer 361. The semiconductor optical device 3 is immersed in an acidic solution to remove a portion of sacrificial layer, so that the residual sacrificial layer 341 forms a micro-structural between the GaN thin film 32 and the nitride-containing semiconductor layer 361. The space of removed sacrificial layer forms an air media layer 342.

Figure 5:
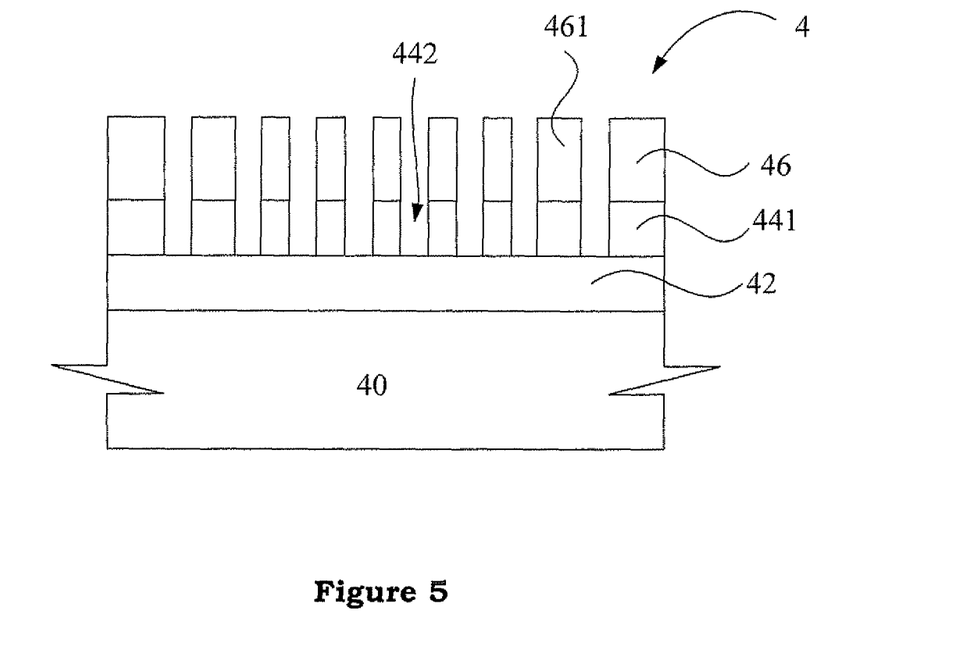
FIG. 5 illustrates the cross-section diagram for a semiconductor optical device having resonance cavity structure in accordance with the technique disclosed in the invention.

In addition, as shown in FIG. 5, the invention further discloses a method for forming a micro resonance cavity between the nitride and the air media layer within a semiconductor optical device 4. As shown in FIG. 5, in the embodiment, the semiconductor optical device 4 includes a substrate 40, a GaN thin film 42 is formed on the substrate 40, a sacrificial layer 441 is formed on the GaN thin film 42 and a nitride-containing semiconductor layer 46 is formed on the sacrificial layer 441. The structure and formation way is the same as those of FIG. 1, which will not be described here again. The micro-structural pattern is defined on the nitride-containing semiconductor layer by E-beam lithography. The inductively coupled plasma reactive ion etching (ICP-RIE) is used to form a plurality of micro-structure 461 on the nitride-containing semiconductor layer. Then, the semiconductor optical device is immersed in an acidic solution to remove a portion of sacrificial layer 441, so that the residual sacrificial layer 441 forms a micro-structural between the GaN thin film 42 and the nitride-containing semiconductor layer 46. The space of removed sacrificial layer forms an air media layer 442. In the embodiment, the micro-structure 461 can be called as the light crystal structure, its purpose is to be used as the resonance cavity, in order to raise the resonance number of light in this semiconductor optical device 4 and increase the light emitting efficiency of semiconductor optical device 4. In the embodiment, the micro-structure 461 may be matrix arranged cylindrical structure or irregularly arranged cylindrical structure.

Figure 6:
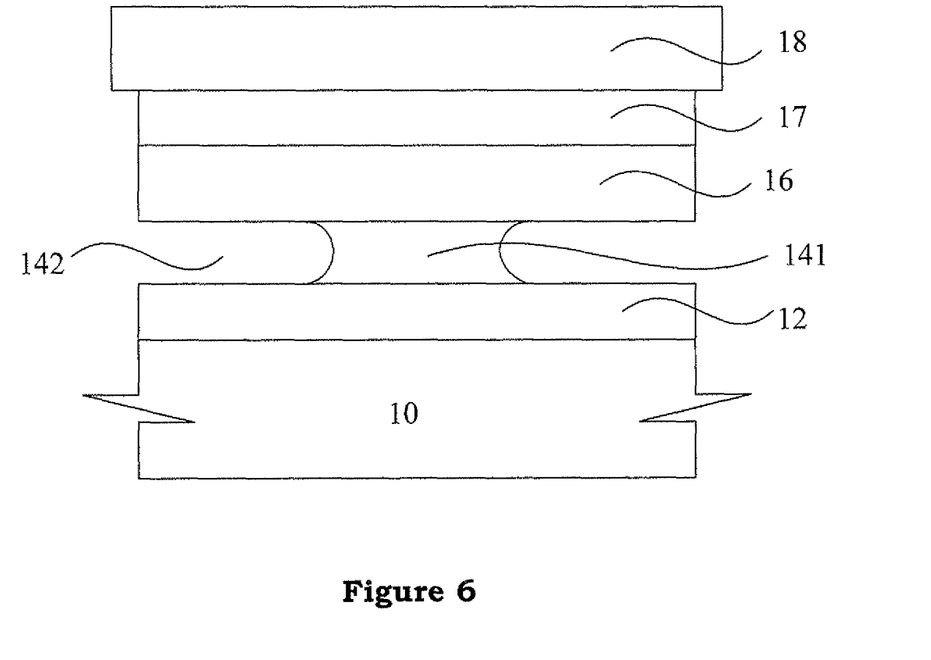
FIG. 6 illustrates the cross-section diagram for a semiconductor optical device having air media layer with a metal bonding layer and another substrate in accordance with the technique disclosed in the invention.

As the semiconductor optical device 1 having air media layer shown in FIG. 1, metal bonding layer 17 and a second substrate 18 can be formed on the nitride-containing semiconductor layer 16, as shown in FIG. 6. The material of bonding metal layer 17 can be titanium alloy or indium alloy. The material of second substrate 18 can be the silicon substrate, flexible substrate or dielectric substrate. The use of second substrate can help the heat dissipation of device and increase the efficiency of optical device, as well as provide the system integration for relevant applications of optical device and semiconductor.

As the same step shown in FIG. 1, the semiconductor optical device 1 is immersed in an acidic solution to get a semiconductor optical device 1 having air media layer 142. Thus, according to the above-mentioned description, the light emitting efficiency of semiconductor optical device can be increased through the sandwich structure formed by the air media layer and the nitride layer.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for fabricating an air media layer within a semiconductor optical device providing a substrate, forming a GaN thin film, forming a sacrificial layer, forming the GaN thin film layer on the sacrificial layer and etching to form an air media layer, comprising:
   providing a substrate;
   forming a nitride-containing semiconductor on the substrate by using a metal-organic chemical vapor deposition method;
   forming a sacrificial layer on the nitride-containing semiconductor by using a molecular beam epitaxy method, wherein a temperature range between about 500° C. to 700° C. is used to form the sacrificial layer;
   forming the GaN thin film layer on the sacrificial layer by using the metal-organic chemical vapor deposition method; and
   etching to remove a portion of the sacrificial layer, comprising:
   defining a micro-structural pattern on the GaN thin film layer by using an E-beam lithography method;
   etching to remove a portion of the GaN thin film layer to form a plurality of micro-structures within the GaN thin film layer by using a inductively coupled plasma reactive ion etching (ICP-RIE) method; and
   wet etching to remove a portion of sacrificial layer to form an air media layer between the GaN thin film and the nitride-containing semiconductor, so that a residual part of the sacrificial layer and a surrounding space forms an air media layer between the GaN thin film layer and the nitride-containing semiconductor layer.

* * * * *